United States Patent [19]

Euen et al.

[11] Patent Number: 4,869,781

[45] Date of Patent: Sep. 26, 1989

[54] METHOD FOR FABRICATING A SEMICONDUCTOR INTEGRATED CIRCUIT STRUCTURE HAVING A SUBMICROMETER LENGTH DEVICE ELEMENT

[75] Inventors: Wolfgang Euen, Boeblingen; Dieter Hagmann, Wildberg; Hans-Joachim Trumpp, Filderstadt, all of Fed. Rep. of Germany

[73] Assignee: International Business Machines Corporation, Armonk, N.Y.

[21] Appl. No.: 259,082

[22] Filed: Oct. 17, 1988

[30] Foreign Application Priority Data

Oct. 30, 1987 [EP] European Pat. Off. ........ 87115967.9

[51] Int. Cl.$^4$ .................. H01L 21/306; B44C 1/22; C03C 15/00; C03C 25/06
[52] U.S. Cl. .................. 156/643; 156/646; 156/653; 156/657; 156/659.1; 156/662; 357/23.9; 357/53; 357/59; 437/41; 437/56; 437/59; 437/228; 437/233; 437/239
[58] Field of Search .............. 156/626, 643, 646, 652, 156/653, 657, 659.1, 662; 357/23.1, 23.9, 41, 42, 49, 53, 59; 437/29, 30, 34, 40, 41, 42, 56, 57, 58, 59, 228, 233, 238, 241, 242, 243; 252/79.1

[56] References Cited

U.S. PATENT DOCUMENTS

| | | | |
|---|---|---|---|
| 4,104,086 | 8/1978 | Bondur et al. | 148/1.5 |
| 4,209,349 | 6/1980 | Ho et al. | 148/187 |
| 4,209,350 | 6/1980 | Ho et al. | 148/188 |
| 4,234,362 | 11/1980 | Riseman | 148/187 |
| 4,256,514 | 3/1981 | Pogge | 148/1.5 |
| 4,397,937 | 8/1983 | Clecak et al. | 430/192 |
| 4,445,267 | 5/1984 | DeLaMoneda et al. | 437/42 X |
| 4,471,523 | 9/1984 | Hu | 29/571 |
| 4,502,914 | 3/1985 | Trumpp et al. | 156/643 |
| 4,616,399 | 10/1986 | Ooka | 437/41 X |
| 4,722,909 | 2/1988 | Parrillo et al. | 437/34 |

FOREIGN PATENT DOCUMENTS

| | | |
|---|---|---|
| WO80/00639 | 4/1980 | European Pat. Off. . |
| 0098318 | 1/1984 | European Pat. Off. . |
| 0146789 | 7/1985 | European Pat. Off. . |
| 0239664 | 10/1987 | European Pat. Off. . |

OTHER PUBLICATIONS

Takebayashi et al., "Infrared Radiation Annealing of Ion-Implanted Polycrystalline Silicon Using A Graphite Heater", J. Electrochem. Soc. vol. 130, No. 11 (Nov. 1983), pp. 2271-2274.

(List continued on next page.)

*Primary Examiner*—William A. Powell
*Attorney, Agent, or Firm*—William D. Sabo; Mark F. Chadurjian; Stephen J. Limanek

[57] ABSTRACT

A method for fabricating a semiconductor integrated circuit structure having a submicrometer length device element is described wherein a surface isolation pattern is formed in a semiconductor substrate to define regions which are designated to contain devices. A first insulating compound layer is formed on the surface of the semiconductor substrate which is designated to be in part the gate dielectric. Subsequently, a polycrystalline silicon layer is deposited onto the compound layer. The polycrystalline silicon layer is heavily doped by phosphorus ion implantation and annealed below about 850° C. Polycrystalline silicon portions are delineated by photolithography and dry etching. Dry etching is carried out in SF$_6$-Cl$_2$/He at a low power density of about 0.1 to 0.3 watts/cm$^2$. The remaining portions of polycrystalline silicon layer are subjected to a thermal oxidation at a temperature of about 800° C. during which controllable quantities of the polycrystalline silicon are consumed. After removal of the thermally grown oxide, polycrystalline silicon portions are obtained with length and thickness dimensions reduced by a desired amount. If polycrystalline silicon portions are to be reduced only in length, the horizontal surfaces of these portions are protected during oxidation by a cap. The cap may include a several nm thick silicon nitride layer which is arranged on a silicon dioxide stress-relieve layer. The method is particularly useful in forming a submicrometer length gate electrode of a field effect transistor.

27 Claims, 3 Drawing Sheets

OTHER PUBLICATIONS

Swaminathan et al., "Diffusion of Arsenic In Polycrystalline Silicon", Appl. Phys. Lett., vol. 40, No. 9 (May 1982), pp. 795–798.

Goto et al., "A New Self-aligned Source/Drain Diffusion Technology from Selectively Oxidized Poly-Silicon," International Electron Devs. Meeting, Technical Digest, pp. 585–588, Lee (Dec. 3–5, 1979).

Lai, "Self-Aligned Contact Process Using An Ion-Implanted Silicon Nitride Film As An Oxidation Mask," IBM Tech. Discl. Bull., vol. 436, No. 8 (Jan. 1984), pp. 4303–07.

Yaron, "Characterization of Phosphorus Implanted Low Pressure Chemical Vapor Deposited Polycrystalline Silicon," Solid State Electronics, vol. 22, No. 12 (Dec. 1979), pp. 1017–1023.

Baunach et al., "Electrical And Morphological Characterization of Multi-Layer Dielectrics," Extended Abstracts, vol. 86-2, Abstract No. 570 (Oct. 19–24, 1986), p. 855.

IBM Tech. Disc. Bulletin by H. B. Pogge, Nov. 1976, vol. 19, No. 6, pp. 2057–2058.

IBM Tech. Disc. Bulletin by E. Bassous, Nov. 1972, vol. 15, No. 6, pp. 1823–1825.

IBM Tech. Disc. Bulletin by S. A. Abbas et al., Sep. 1977, vol. 20, No. 4, pp.1376–1378.

IBM Tech. Disc. Bulletin by E. Bassous et al., May 1979, vol. 21, No. 12, pp. 5035–5038.

Journal of the Electrochemical Society by W. J. M. J. Josquin et al., vol. 129, No. 8, Aug. 1982, p. 1803.

IEEE Transactions on Electron Devices by L. Epraph, vol. ED-28, No. 11, Nov. 1981, pp. 1315–1319.

METHOD FOR FABRICATING A SEMICONDUCTOR INTEGRATED CIRCUIT STRUCTURE HAVING A SUBMICROMETER LENGTH DEVICE ELEMENT

TECHNICAL FIELD

This invention relates to a method for fabricating semiconductor integrated circuit structures which have field effect transistor devices therein having a submicrometer gate length.

BACKGROUND ART

In today's integrated circuit technology it is desirable to obtain linewidths in the range of about 0.5 $\mu$m by using standard photolithography techniques, and to avoid the application of more complex techniques such as E-beam or X-ray lithography. Recently, there has been significant effort in the integrated circuit field to develop processes for making submicrometer channel length field effect transistors with a high degree of channel length control. Examples of this work are described in U.S. Pat. Nos. 4,209,349, filed on Nov. 3, 1978, by I. T. Ho et al, 4,209,350, filed on Nov. 3, 1978, by I. T. Ho et al, 4,234,362, filed on Nov. 3, 1978, by J. Riseman, 4,256,514, filed on Nov. 3, 1978, by H. B. Pogge, and 4,502,914, filed on Oct. 28, 1983, by H. J. Trumpp et al. These patents all involve the formation of substantially horizontal surfaces and substantially vertical surfaces on a silicon body, and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending on the original thickness of the layer applied. In this way a narrow dimension region such as a field effect transistor gate of submicrometer length can be obtained.

Another approach uses a tri-layer resist system to define the gate electrode of a field effect transistor by photo or E-beam lithography. In this process (see for example PCT Application No. WO-A-80/00639) a comparatively thick bottom polymer or resist layer is deposited on the surface of a polycrystalline silicon layer which is designated to be in part the gate electrode. After a baking step an intermediate barrier layer of silicon dioxide or nitride is deposited by chemical vapor deposition at room temperature. The top layer is a highly sensitive positive photoresist layer in which the desired pattern of the gate electrode is generated by optical or E-beam exposure and development. Pattern transfer from the top resist to the silicon dioxide or nitride barrier layer is achieved by plasma etching with carbon tetrafluoride ($CF_4$). An oxygen reactive ion etch (RIE) process is used to transfer the pattern to the bottom polymer or resist layer. According to this approach the bottom resist layer is oxygen etched at a relatively high pressure for obtaining lateral bias etching of the silicon dioxide/nitride barrier layer by a particular amount. The resulting bottom layer photoresist bars, decreased by the line width bias over the original line width of the top resist layer, serve as a photoresist mask for the subsequent polycrystalline silicon RIE step. This step has poor dimensional control as it is known that the base of the photoresist bars is not exactly defined and differs in width to a considerable extent from the wafer center to the edge. In addition, due to the overhanging oxide or nitride, the lateral oxygen etch rate is not constant with respect to time, and the average line width bias is limited by the geometry.

DISCLOSURE OF THE INVENTION

It is, therefore, an object of this invention to provide a process for fabricating a short channel field effect transistor with high dimensional control which can be integrated into integrated circuit structures that is useful in memory or logic.

In accordance with the present invention a method for fabricating a semiconductor integrated circuit structure having a submicrometer length device element is described wherein a surface isolation pattern is formed in a semiconductor substrate which isolates regions of the semiconductor within the substrate from one another. These semiconductor regions are designated to contain devices. A first insulating compound layer is formed on the surface of the semiconductor substrate which is designated to be in part the gate dielectric layer. A polycrystalline silicon layer is deposited on this insulating compound layer. The polycrystalline silicon layer is heavily doped by ion implantation and annealed below about 850° C. The polycrystalline silicon layer is dry-etched to leave polycrystalline silicon portions with sidewall angles of at least 90°. The polycrystalline silicon portions are thermally oxidized, and the thermal oxide is removed to leave polycrystalline silicon portions of reduced submicrometer thickness and length. Subsequently, the desired pattern of PN junctions is formed in the semiconductor substrate, using, for example, ion implantation techniques, with the controlled submicrometer length polycrystalline silicon portions serving as a mask. If only a lateral reduction of the polycrystalline silicon portions is desired a second insulating layer is deposited on the polycrystalline silicon layer. The second insulating layer as well as the polycrystalline silicon layer are patterned by dry etching. The caps remaining of the second insulating layer on the polycrystalline silicon portions prevent a surface oxidation but allow a lateral oxidation of these portions.

This method described in the preceding paragraph may find particular application for the formation of submicrometer gate length field effect transistor devices in an integrated circuit structure. It is preferred in this case that the first insulating compound layer is formed of a combination of silicon dioxide of about 4 to 6 nm, of silicon nitride of about 11 to 15 nm, and of silicon dioxide of about 1.0 to 1.5 nm thickness. The polycrystalline silicon layer has a thickness in the range of about 350 to 650 nm. The doping of this layer is preferably done by ion implantation of phosphorus or arsenic at a dose in the range of about 1 to $4 \times 10^{16}/cm^2$ at approximately 40 to 80 KeV. Following the ion implantation the polycrystalline silicon layer is annealed at about 800° C. to produce a higher phosphorus or arsenic ion concentration in its upper part. The pattern of polycrystalline silicon portions with substantially vertical sidewalls is preferably made by RIE etching using an etching gas composition of about 6 to 8% by volume of sulfur hexafluoride ($SF_6$), 2 to 3% by volume of chlorine ($Cl_2$), remainder helium (He), and a comparatively low power density of about 0.1 to 0.3 watts/$cm^2$. The high concentration of doping material in the polycrystalline silicon layer allows thermal oxidation of this layer at a lower temperature than previously used, namely, at a temperature of about 800° C. This concentration also allows a uniform thermal growth of silicon dioxide which is easily to be controlled.

Effort has been expended in the integrated circuit field to reduce the line dimensions of porous silicon or polycrystalline silicon by oxidation and removal of the oxidized portions. One technique is described by H. B. Pogge in IBM Technical Disclosure Bulletin, November 1976, Vol. 19, No. 6, pp. 2057-2058, entitled "NARROW LINE-WIDTH MASKING METHOD." This method involves the use of a porous silicon followed by the oxidation of the porous silicon. Other techniques are described by E. Bassous in IBM Technical Disclosure Bulletin, November 1972, Vol. 15, No. 6, pp. 1823-1825, entitled "FABRICATION SUBMICROMETER SILICON DEVICES" by S. A. Abbas et al, ibid., September 1977, Vol. 20, No. 4, pp. 1376-1378, entitled "EXTENDING THE MINIMAL DIMENSIONS OF PHOTOLITHOGRAPHIC INTEGRATED-CIRCUIT FABRICATION PROCESSING" and by E. Bassous et al, ibid., May 1979, Vol. 21, No. 12, pp. 5035-5038, entitled "METHOD OF FABRICATING HIGH-PERFORMANCE IGFET STRUCTURES WITH HIGHLY CONTROLLABLE SUBMICRON EFFECTIVE CHANNEL LENGTHS". These publications all involve the use of polycrystalline silicon masking layers which are made into a mask by first using an intermediate mask of oxidation blocking material, such as silicon oxide or nitride, and the thermal oxidation of polycrystalline silicon for line width reduction. Line dimensions of less than 2 micrometers may be obtained.

All these techniques use undoped or in situ doped polycrystalline silicon which is difficult to oxidize as it is known that the thermal oxide growth on polycrystalline silicon is not readily controllable or uniform owing to the polycrystalline structure of the underlying silicon. Therefore, the control of the crucial length of the gate electrode, and hence of the underlying transistor channel is deteriorated. In addition, the thickness of the masks (caps) of oxidation blocking material was previously of the order of about 100 nm or more so that a wet etching step was required for the removal of such caps.

The method of this invention mitigates these shortcomings of the prior art by using a polycrystalline silicon layer which is implanted at a high ion dose and annealed at about 800° to 850° C. which later on provides for an extremely uniform thermal oxide growth on the underlaying polycrystalline silicon in a shorter period of time than previously. The thickness of the oxidation blocking material on the polycrystalline silicon layer is now in the order of several nm only so that a dry etching step of very short duration is sufficient for its removal.

The foregoing and other objects, features and advantages of the invention will be apparent from the following more particular description of the preferred embodiments of the invention, as illustrated in the accompanying drawings.

BRIEF DESCRIPTION OF THE DRAWINGS

FIGS. 1A through 5A, 6 and 7 schematically illustrate a process for forming submicrometer channel length field effect transistors of the present invention, and FIGS. 1B through 5B illustrate a modification of the FIGS. 1A through 5A embodiment.

BEST MODE FOR CARRYING OUT THE INVENTION

Referring now more particularly to the figures of the drawings, there are illustrated two embodiments for fabricating submicrometer channel length field effect transistors in a high density integrated circuit structure. The process is illustrated to form N channel metal oxide semiconductor field effect transistor (MOSFET) integrated circuits. However, it would be obvious that P channel field effect transistors can alternatively be formed by the present embodiments by simply reversing the polarity of the various elements of the transistors and associated regions.

Figure 1A:
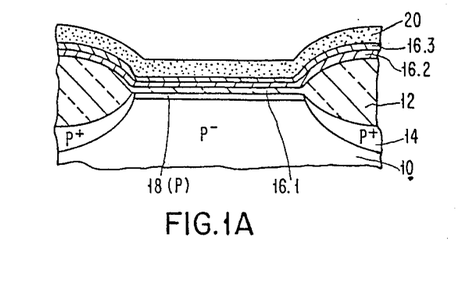
Figure 1B:
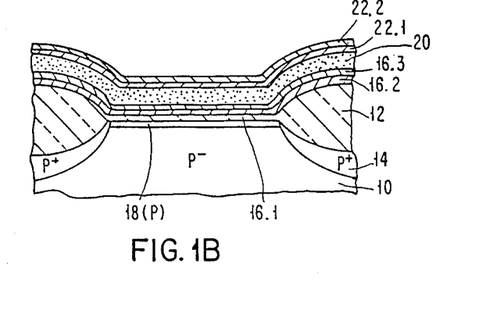

The first series of steps involve the formation of the isolation regions for isolating regions of monocrystalline silicon from other regions of monocrystalline silicon in a P-<100> crystallographic oriented silicon substrate 10 as thus can be seen with reference to FIGS. 1A and 1B. The isolation may preferably be partial dielectric isolation using materials such as silicon dioxide, glass, polyimide, etc., alone or in combinations. The preferred pattern of partial dielectric isolation 12 defines monocrystalline silicon surface regions wherein field effect devices will ultimately be formed. There are many ways in the art to form dielectric isolation regions of this type. For example, detailed processes for forming dielectric isolation regions are described in U.S. Pat. Nos. 4,104,086, filed on Aug. 15, 1977, by J. A. Bondur et al and 4,471,523, filed on May 2, 1983 by G. J. Hu. A P+ region 14 is typically formed under the dielectric isolation layer region 12 to prevent a formation of an inversion layer and the resulting electrical leakage between isolated monocrystalline regions under the isolation region 12.

The recessed dielectric isolation region 12 and P+ region 14 may be formed by first thermally oxidizing the surface of the silicon substrate 10 to form a silicon dioxide layer (not shown) thereon. A silicon nitride layer (not shown) is then deposited by chemical vapor deposition thereover. The silicon nitride layer has openings formed therein at the desired location of the isolation regions by conventional lithography and etching techniques. The P+ region 14 is formed by the ion implantation of boron through the silicon dioxide layer in the openings in the silicon nitride layer. The silicon nitride layer forms an effective mask to the penetration of the boron ions in the remaining areas covering the surface of the wafer. The recessed oxide isolation region 12 is then grown by placing the wafer in an oxidation ambient for a time sufficient to form the recessed oxidation regions 12. The silicon nitride and silicon dioxide layers are now removed from the surface of the silicon wafer. The surface isolation pattern in the semiconductor silicon substrate which isolates regions of the semiconductor within the substrate from one another is now formed.

An insulating layer 16.1,16.2,16.3 is formed on the surface of the silicon body 10. This layer may be thermally grown silicon dioxide which is designated to be in part the gate dielectric layer upon the surface of the silicon substrate. Alternatively, this layer may be composed of silicon dioxide, silicon nitride, nitrided silicon dioxide, silicon dioxide implanted with nitrogen ($N_2$) ions, polycrystalline aluminum trioxide or the like or combinations of the foregoing. The layer thickness of these materials is not noticeably changed by subsequent thermal oxidation. In accordance with the present invention the insulating layer is formed of a combination of silicon dioxide 16.1, silicon nitride 16.2, and silicon dioxide 16.3. The thickness of the individual layers are, for example, of 4 to 6 nanometers silicon dioxide 16.1, of 11 to 15 nanometers silicon nitride 16.2 and of 1.0 to 1.5 nanometers silicon dioxide 16.3. Silicon nitride and silicon dioxide layers 16.2 and 16.3 cover the entire surface having the surface isolation pattern 12 and over the silicon dioxide layer 16.1. The silicon dioxide layers are preferably thermally grown in oxygen or oxygen-water vapor ambient at a temperature of about 800° C. A second method for growing silicon dioxide involves a chemical vapor deposition process wherein silicon dioxide ($SiO_2$) is deposited by using silane ($SiH_4$) and oxygen ($O_2$) at about 450° C. under atmospheric or low pressure conditions. The silicon nitride layer is usually formed by chemical vapor deposition using the following process conditions: $SiH_4$, ammonia ($NH_3$) and nitrogen ($N_2$) carrier gas at a temperature of about 800° C. under atmospheric or low pressure conditions.

The surface conductivity of the P- substrate 10 is adjusted where the field effect transistors are to be formed. The threshold voltage, Vt, is adjusted by using, for example, a boron ion implantation of about $1.2 \times 10^{12}/cm^2$ dose at approximately 7 KeV to produce surface P regions 18.

There is now deposited polycrystalline silicon layer 20 onto the entire surface of silicon dioxide/silicon nitride/silicon dioxide compound layer 16.1,16.2,16.3. The polycrystalline silicon layer is deposited by using silane in a hydrogen ambient in the temperature range of about 600° C. to 650° C., and preferably about 625° C. The operative thickness of the polycrystalline silicon layer is between about 350 to 650 nanometers with 430 nanometers being preferred. The polycrystalline silicon layer makes no electrical contact to the silicon body 10 since it is formed upon insulating compound layer 16.1,16.2,16.3. The entire surface of polycrystalline silicon layer 20 is then doped by ion implantation of phosphorus or arsenic and a heating process.

Whereas in situ doping of polycrystalline silicon is limited by the solubility of the doping material in polycrystalline silicon and a homogeneous distribution of this material prevents a local influence on the oxidation rate of polycrystalline silicon, ion implantation doping results in concentrations of doping material far beyond its solubility limit. As the oxide uniformity and the oxidation rate of the polycrystalline silicon largely depend on the concentration of the doping material and the oxidation rate rises as this concentration increases and as it is desirable to keep later oxidation duration as short as possible, a high concentration of doping material is preferred. Therefore, in accordance with the invention, the polycrystalline silicon layer 20 is implanted at a phosphorus ion dose in the range of about 1 to $4 \times 10^{16}/cm^2$ at approximately 40 to 80 KeV. Following the implantation, the wafers are annealed in $N_2$ for about one hour in the temperature range of about 800° to 850° C. This annealing treatment causes a distribution of the phosphorus ions in the polycrystalline silicon layer resulting in a higher phosphorus concentration in the upper part of the layer. For example, phosphorus concentration profiles measured in an about 430 nm thick polycrystalline silicon layer show in the top quarter a phosphorus ion concentration about twice as high as in the remainder of the layer. This concentration profile which depends on the implantation energy and on the annealing temperatures is important for later oxidation and etching processes. If annealing would take place at higher temperatures, for example, at about 900° to 1,000° C., a complete redistribution of the implanted phosphorus ions would take place resulting in a constant concentration throughout polycrystalline silicon layer 20.

Figure 2A:
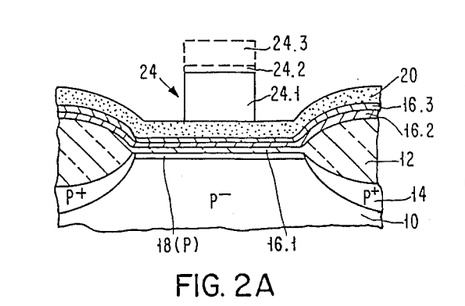
Figure 2B:
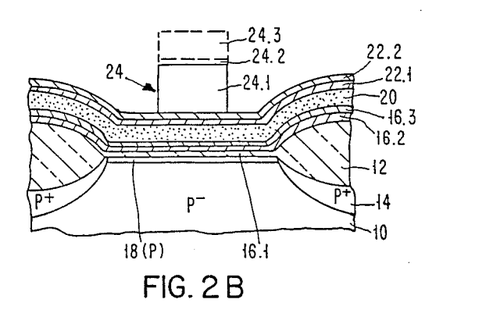

In a preferred embodiment of the invention, as indicated in FIG. 2B, a double layer of silicon dioxide/silicon nitride is formed on polycrystalline silicon layer 20, which is used later on to define portions of polycrystalline silicon and which prevents surface oxidation but allows lateral oxidation of these portions. Silicon dioxide layer 22.1, shown in FIG. 1B, is thermally grown or deposited by chemical vapor deposition on the polycrystalline silicon layer 20, and silicon nitride layer 22.2 is deposited by chemical vapor deposition on silicon dioxide layer 22.1 using the process conditions as mentioned hereinbefore. The thicknesses of these layers are, for example, of 5 to 8 nanometers silicon dioxide and of 4 to 6 nanometers silicon nitride.

Alternatively, an insulating layer can be formed on polycrystalline silicon layer 20 in the same step as the doping of this layer is effected by implanting ions which contain nitrogen in addition to phosphorus. For example, species like $PN_2^+$ are implanted with a dose of the order of $2.1 \times 10^{16}/cm^2$ and 50 KeV followed by an annealing step of one hour at about 850° C. in $N_2^+$. During annealing the phosphorus ions distribute throughout polycrystalline silicon layer 20, whereas the nitrogen ions migrate to the surface of this layer to form a surface nitride layer thereon. Details on the mechanism of molecular nitrogen ion ($N_2^+$) implantation can be found, for example, in W. J. M. J. Josquin et al, Journal of the Electrochemical Society, Vol. 129, No. 8, August 1982, pp. 1803.

The process of forming remaining portions of polycrystalline silicon layer 20 of controlled submicrometer length, and having substantially vertical sidewalls, may be better understood with reference to FIGS. 2A, 2B, 3A, 3B, 4A, and 4B.

For making a photoresist mask 24, shown in FIGS. 2A and 2B, on polycrystalline silicon layer 20, a standard photolithographic process is used. In this process a photoresist is applied in a thickness of about 1 μm to the surface of polycrystalline silicon layer 20. A variety of known positive resists are suitable for this purpose, for example, the AZ 1450J photoresist of the Shipley Company which is based upon a phenolformaldehyde resin and a benzophenone-naphthoquinone-diazide sensitizer, or the TNS photoresist described in U.S. Pat. No. 4,397,937, filed on Feb. 10, 1982, by N. J. Clecak et al, which is based upon a phenolic resin and a bisester of 1-oxo-2-diazonaphthalene sulfonic acid and of an unsymmetrical primary or secondary aliphatic diol as sensitizer. Patterning of an AZ photoresist layer is carried out by means of a known ultraviolet (UV) exposure tool using a 436 nm wavelength exposure followed by a baking step in the temperature range of about 95° to 105° C. for about 30 minutes in $N_2$ and development in an aqueous AZ developer based upon tetramethylammonium hydroxide.

Alternatively, a tri-layer resist system can be used for making the photoresist mask. In this process an about 1 to 3 μm thick polymer or resist layer 24.1 is deposited on the surface of polycrystalline silicon layer 20 followed by a baking step at about 210° C. for about 30 minutes. An intermediate masking layer 24.2 of silicon nitride is then deposited in a thickness of 0.1 to 0.2 μm by plasma-enhanced chemical vapor deposition (CVD) at room temperature. A top layer 24.3 is a 0.2 to 1 μm thick layer of a highly sensitive positive photoresist in which the desired pattern is generated as described hereinabove. For patterns with submicrometer dimensions E-beam exposure is used. Pattern transfer from the top resist to the silicon nitride 24.2 is achieved by plasma etching with $CF_4$ at about 66.5 microbars. An oxygen reactive ion etch process is used to transfer the pattern to the bottom polymer or resist layer. A 0.1 watts/cm$^2$ RF power density at a pressure of about 5 microbars resulted in a 70 nm/minute etch rate. As a result of reduced tolerances during the production of the photoresist mask this tri-layer process step yields strictly vertical photoresist sidewalls.

Figure 3A:
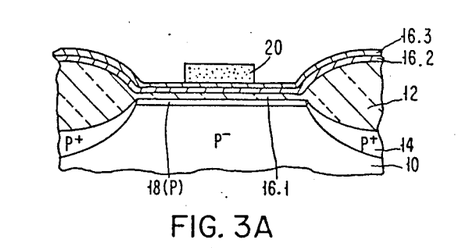

There now follows the etching of polycrystalline silicon layer 20 to produce portions of submicrometer length which extend across the designated FET channel device regions. One such portion is shown in FIG. 3A. The etching step is anisotropic such as reactive ion etching, RIE, in $SF_6/Cl_2/He$. A $CF_4$ etching step may precede to remove the native oxide from the polycrystalline silicon.

According to test results, the process for reducing the FET channel length by removing controllable quantities of the polycrystalline silicon portions covering these device regions can only be successfully conducted if, by anisotropic etching, polycrystalline silicon portions with sidewall angles of 90 degrees, preferably of 90 to 92 degrees are obtainable. With lower angles trenches are formed in the silicon dioxide/silicon nitride compound gate 16.2, 16.3 at the lower end of the polycrystalline silicon sidewall which makes the devices unserviceable. Therefore, an etching process had to be developed which provides for good selectivity between polycrystalline silicon and silicon nitride and silicon dioxide, respectively, and which generates 90 degree angles. In order to provide for selectivity of about 15:1 between polycrystalline silicon and silicon nitride and to avoid etching through the silicon nitride of the compound gate, and the above described trenching at the lower end of the polycrystalline silicon sidewalls, RIE has to be carried out at low power density, preferably at about 0.1 to 0.3 watts/cm$^2$ up to the endpoint and, from there, at <0.05 watts/cm$^2$ with about 15% overetching. The etching endpoint is determined by means of laser interference.

In one example polycrystalline silicon layer 20 is etched in the areas exposed by photoresist mask 24 or 24.1 of FIGS. 2A and 2B with the following parameters:
  etching gas: $SF_6/Cl_2/He$
  composition, % b. v.: 7.5 2.5 90
  flow, sccm/min.: 40
  pressure, μbar: 65
  etching time, min.: 8 to 10
  power, W: 100
  power density, W/cm$^2$: 0.1 to 0.3 (<0.05 from endpoint)

It should be pointed out that the above given etching parameters have to be adjusted to the apparatus used. Furthermore, a number of variations of the above process can be carried out to optimize the procedure and to simplify the fabrication process.

The remaining photoresist etching mask is removed by isotropic stripping in an oxygen plasma to leave the structure of FIG. 3A with vertical polycrystalline silicon sidewalls.

The etching of the double layer of silicon dioxide/silicon nitride 22.1, 22.2, shown in FIG. 1B, arranged on polycrystalline silicon layer 20, according to the above described preferred embodiment, has to be carried out using an etching gas different from that for the etching of polycrystalline silicon. This etching step is also a reactive ion etch, RIE, in a $CF_4$ plasma. In one example the double layer is etched in the areas exposed by photoresist mask 24 of FIG. 2B, which is generated as described before, with the following parameters:
  etching gas: $CF_4$
  flow, sccm/min.: 15
  pressure, μbar: 50
  etching time, min.: 2
  power, W: 250
  power density, W/cm$^2$: 0.25

This etching step also removes native oxide from the polycrystalline silicon surface. Subsequently, polycrystalline silicon layer 20 is etched in the same chamber, using $SF_6/Cl_2/He$ as etching gas and the parameters described above. The photoresist mask is removed in an oxygen plasma to leave the structure of FIG. 3B with vertical polycrystalline silicon sidewalls.

Figure 4A:
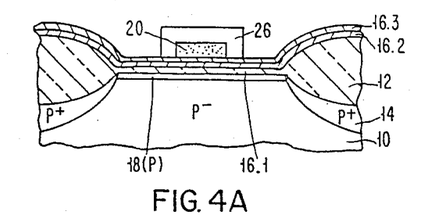

The process continues with the oxidation of the remaining portions of polycrystalline silicon layer 20. For that purpose, the whole structure of FIG. 3A is subjected to a conventional thermal oxidation during which controllable quantities of the polycrystalline silicon are consumed. The result of this is shown in FIG. 4A. When the polycrystalline silicon is oxidized to silicon dioxide, the thickness of the oxide formed is about twice the thickness of the reacted silicon.

According to test results it is possible, because of the high concentration of doping material in the polycrystalline silicon, to thermally oxidize this material in a temperature range of about or below 800° C. in a relatively short period of four to seven hours in a water/oxygen ambient in order to obtain the oxide thickness of several 100 nanometers as required in the process according to the invention. Under these conditions the channel doping profile will not be negatively affected. As the phosphorus or arsenic ion concentration in the upper part of polycrystalline silicon layer 20 differs from that in the lower part, it is also possible to locally influence the oxidation rate of this layer depending on its ion concentration. Normally, the oxidation of undoped or in situ doped polycrystalline silicon with a homogenous distribution of doping material is difficult to control, because the oxidation rates at the upper and at the lower end of the sidewalls of the respective polycrystalline silicon portions differ, and projections (horns) are formed at the upper end. For inhibiting the formation of those horns, a higher concentration of phosphorus or arsenic ions is chosen for the upper part of polycrystalline silicon layer 20, which increases the oxidation rate of this part.

Figure 5A:
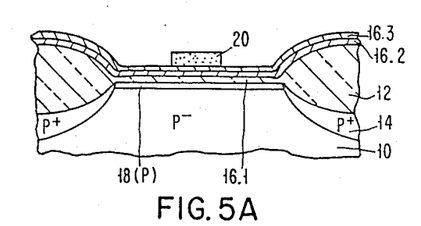

Subsequently, the thermal oxide 26, indicated in FIG. 4A, is removed from all surfaces of polycrystalline silicon portions 20 such as by plasma etching or wet etching in concentrated hydrofluoric acid with silicon nitride layer 16.2 acting as an etch barrier. After removal of the thermally grown oxide 26, polycrystalline silicon portions 20, shown FIG. 5A, are obtained with length and thickness dimensions reduced by the desired amount.

In one example, in FIG. 4A, silicon dioxide is thermally grown at about 800° C. in a thickness of about 333 nm on a portion of polycrystalline silicon layer 20 having a length of 0.9 μm and a thickness of 0.45 μm. After removal of the oxide with concentrated hydrofluoric acid a structure having a length of 0.60 μm and a thickness of 0.30 μm is obtained. The oxide was grown in the required thickness within about four hours. The reduction in thickness of the polycrystalline silicon portion is compensated for by the deposition of a correspondingly thicker polycrystalline silicon layer 20.

Figure 3B:
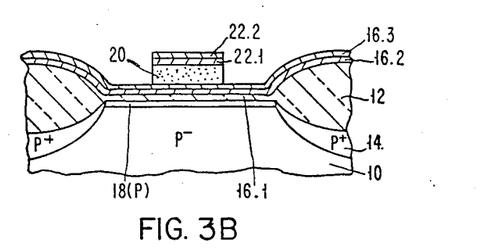
Figure 4B:
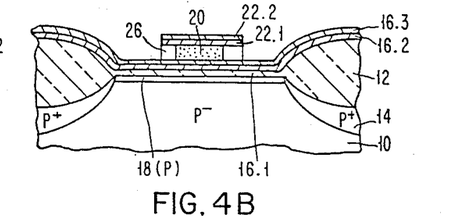
Figure 5B:
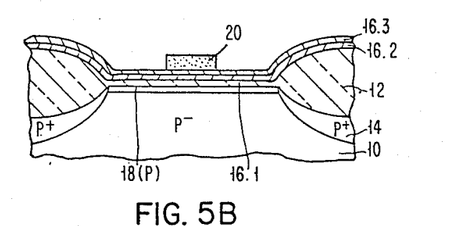

If only a reduction of length and not of the thickness of polycrystalline silicon portions 20 is desired, the horizontal surfaces of these portions have to be protected during oxidation by the cap 22.1,22.2 of FIG. 3B. According to prior art this cap may consist of silicon nitride in a layer thickness of about 100 nm. However, to ensure a complete removal of the nitride cap together with the thermal silicon dioxide by etching, the maximum nitride layer thickness of the present invention should not exceed 4 to 6 nanometers. It turned out that, owing to this small thickness, the silicon nitride layer was destroyed by stresses generated during the lateral oxidation of the polycrystalline silicon portions, and failed to prevent the oxidation of the horizontal surfaces of these portions. Therefore, a stress-relieve layer consisting of silicon dioxide and having a thickness about 5 to 8 nanometers, which effectively prevents the destruction of the silicon nitride layer during oxidation, is arranged between the polycrystalline silicon layer and the silicon nitride layer. The process steps for the deposition of silicon dioxide and silicon nitride layers 22.1 and 22.2 have been described hereinabove with reference to FIG. 1B. As shown in FIG. 4B, when the structure is subjected to conventional thermal oxidation, controllable quantities of the polycrystalline silicon portion 20 are consumed laterally beneath the silicon dioxide/silicon nitride cap 22.1,22.2 to produce silicon dioxide portions 26. With the consumption of polycrystalline silicon in the formation of silicon dioxide portions 26, the lengths of polycrystalline silicon portion 20 may be reduced from about 0.72 μm or 0.75 μm down to about 0.29 μm and 0.33 μm, respectively. Finally, silicon dioxide portions 26 and silicon dioxide/silicon nitride cap 22.1,22.2 are simultaneously removed by etching techniques to leave the polycrystalline silicon portion 20 of FIG. 5B having the required narrowed lateral dimensions.

Figure 6:
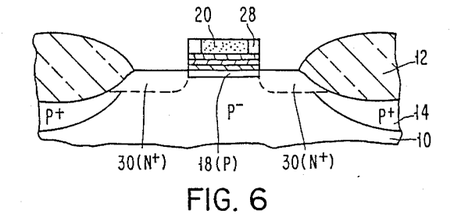

The process continues with polycrystalline silicon portion 20 being the gate electrode of the field effect transistor device. The exposed compound gate dielectric silicon dioxide/silicon nitride/silicon dioxide 16.1, 16.2, 16.3 can either be removed by etching followed by the implantation or diffusion of phosphorus or arsenic dopants adjacent to the gate electrode to form the desired PN junction source/drain elements for the field effect transistor device, or the compound gate dielectric can be allowed to remain and ion implantation with the appropriate energy to penetrate this compound layer is used to form the N+ source/drain regions in the device areas. One example of the ion implantation method uses arsenic as the conductivity imparting impurity of the order of $2.0 \times 10^{15}$ ions/cm$^2$ and 80 KeV to form a PN junction of 0.4 μm depth. In a preferred embodiment of this process step, before forming such regions, a conformal chemically vapor deposited silicon dioxide or the like insulator layer (not shown) is formed over the entire device structure. One preferred method, as taught in European Patent Application No. 86104596.1, for making such an insulator layer by chemical vapor deposition under reduced pressure uses tetraethylorthosilicate (TEOS) as a source for silicon and oxygen, which is directed across the heated substrates. Anisotropic etching is utilized to remove the horizontal conformal chemical vapor deposition layer and leave the spacer sidewall silicon dioxide layers 28 on the sides of polycrystalline silicon portion 20. The spacers 28 are shown in FIG. 6.

Figure 7:
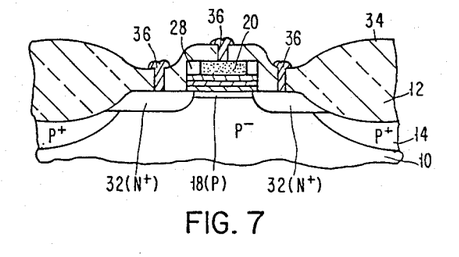

The ion implantation of conductivity imparting impurities, typically phosphorus or arsenic, is indicated by the dashed lines 30 in the substrate. Subsequent oxidation and annealing steps completely form the source/drain regions from the dashed lines 30 to the solid lines 32 as shown in FIG. 7. FIG. 7 also illustrates the result of the formation of the phosphosilicate glass insulating layer 34 and the metal electrical contacts 36 to the various elements of the devices. It is also feasible to form a polycide layer (not shown) on top of the polycrystalline silicon layer 20 to lower its sheet resistance. Details relating to anisotropic etching of polycide layers are described, for instance, by L. Epraph in the IEEE Transactions on Electron Devices, Vol. ED-28, No. 11, November 1981, pp. 1315–1319.

While the invention has been particularly shown and described with reference to the preferred embodiments thereof, it will be understood by those skilled in the art that various changes in form and details may be made therein without departing from the spirit and scope of the invention.

What is claimed is:

1. A method for fabricating a semiconductor integrated circuit structure having a submicrometer length device element comprising:
   forming a surface isolation pattern in a semiconductor substrate to define regions which are designated to contain a device having a gate,
   forming a first insulating compound layer on the surface of said semiconductor substrate which is designated to be in part a dielectric layer of said gate,
   depositing a polycrystalline silicon layer on said insulating compound layer, heavily doping said layer by ion implantation and annealing at a temperature below about 850° C.,
   delineating polycrystalline silicon portions by photolithography and dry etching to leave polycrystalline silicon portions with sidewall angles of at least 90°.
   thermally oxidizing said polycrystalline silicon portions and removing the resulting thermally oxidized portions by etching to leave polycrystalline silicon portions of controlled submicrometer thickness and length, and
   forming a desired pattern of PN junctions in said substrate using the controlled submicrometer length polycrystalline silicon portions as a mask.

2. A method as set forth in claim 1 further comprising forming a second insulating compound layer on said polycrystalline silicon layer before delineating said polycrystalline silicon portions.

3. A method as set forth in claim 2 further comprising removing all portions of said second insulating compound layer along with said resulting thermally oxidized portions.

4. A method as set forth in claim 1 wherein said insulating compound layer is formed of a combination of individual first silicon dioxide, silicon nitride, and second silicon dioxide layers with the first silicon dioxide layer being thermally grown and the silicon nitride layer being vapor deposited.

5. A method as set forth in claim 4 wherein said individual layers are of a thickness of about 4 to 6 nm of said first silicon dioxide layer, of about 11 to 15 nm of said silicon nitride layer, and of about 1.0 to 1.5 nm of said second silicon dioxide layer.

6. A method as set forth in claim 1 wherein said polycrystalline silicon layer is chemically vapor deposited onto the surface of said compound insulating layer by using silane in a $H_2$ ambient in a temperature range of about 600° to 650° C.

7. A method as set forth in claim 6 wherein said polycrystalline silicon layer is deposited in a thickness in the range of about 350 to 650 nm.

8. A method as set forth in of claim 1 wherein said polycrystalline silicon layer is implanted with a phosphorus or arsenic ion dose in the range of about 1 to $4 \times 10^{16}/cm^2$ at approximately 40 to 80 KeV.

9. A method as set forth in claim 8 wherein, following said ion implantation, said polycrystalline silicon layer is annealed at about 800° C. to produce a higher phosphorus or arsenic ion concentration in the upper part of this layer.

10. A method as set forth in claim 3 wherein the second insulating compound layer is formed of a combination of individual silicon dioxide and silicon nitride layers.

11. A method as set forth in claim 10 wherein said individual layers are of a thickness of about 5 to 8 nm of said silicon dioxide layer, and of a thickness of about 4 to 6 nm of said silicon nitride layer.

12. A method as set forth in of claim 3 wherein the second insulating compound layer is silicon nitride, and is formed by implanting ions which contain nitrogen in addition to phosphorus into said polycrystalline silicon layer, and annealing same.

13. A method as set for in claim 1 wherein a photoresist mask is formed on said polycrystalline silicon layer for delineating said polycrystalline silicon portions.

14. A method as set forth in claim 3 wherein a photoresist mask is formed on said second insulating compound layer for delineating said polycrystalline silicon portions.

15. A method as set forth in claim 13 wherein a tri-layer resist system containing an about 1 to 3 $\mu m$ thick polymer layer, an about 0.1 to 0.2 $\mu m$ thick silicon nitride layer, and an about 0.2 to 1 $\mu m$ thick top resist layer are used for forming a photoresist mask with vertical sidewalls.

16. A method as set forth in claim 13 wherein a tri-layer resist system containing about 1 to 3 $\mu m$ thick resist layer, an about 0.1 to 0.2 $\mu m$ thick silicon nitride layer, and an about 0.2 to 0.1 $\mu m$ thick top resist layer are used for forming a photoresist mask with vertical walls.

17. A method as set forth in claim 14 wherein a tri-layer resist system about 1 to 3 $\mu m$ thick polymer layer, an about 0.1 to 0.2 $\mu m$ thick silicon nitride layer, and an about 0.2 to 1.0 $\mu m$ thick top resist layer are used for forming a photoresist mask with vertical sidewalls.

18. A method as set forth in claim 14 wherein a tri-layer resist system containing an about 1 to 3 $\mu m$ thick resist layer, and an about 0.1 to 0.2 $\mu m$ thick silicon nitride layer, and an about 0.2 to 1.0 $\mu m$ thick top resist layer are used for forming a photoresist mask with vertical sidewalls.

19. A method as set forth in claim 1 wherein said polycrystalline silicon layer is reactively ion etched in the areas exposed by photoresist mask using an etching gas composition, in percent by volume, of about 6 to 8% $SF_6$, and 2 to 3% $Cl_2$, with the remainder being He.

20. A method as set forth in claim 1 wherein reactive ion etching of polycrystalline silicon layer is carried out at low power density.

21. A method as set forth in claim 20 wherein said reactive ion etching of said polycrystalline silicon layer is carried out at about 0.1 to 0.3 watts/$cm^2$ up to the endpoint and, from there, at about $<0.05$ watts/$cm^2$ with about 15% overetching.

22. A method as set forth in claim 3 wherein said second compound insulating layer is reactively ion etched in a $CF_4$ plasma.

23. A method as set forth in claim 1 wherein the remaining portions of said polycrystalline silicon layer are thermally oxidized in a water/oxygen ambient at a temperature of about 800° C.

24. A method as set forth in claim 23 wherein thermal oxide formed by thermally oxidizing is removed by plasma etching to leave polycrystalline silicon portions having narrowed lateral dimensions.

25. A method as set forth in claim 23 wherein thermal oxide formed by thermally oxidizing is removed by wet etching to leave polycrystalline silicon portions having narrowed lateral dimensions.

26. A method for fabricating a semiconductor integrated circuit structure including a submicrometer length device element in a device having a gate comprising:
   forming a first insulating layer on the surface of a semiconductor substrate which is designated to be in part a dielectric layer of said gate,
   depositing a polycrystalline silicon layer on said insulating layer, heavily doping said polycrystalline silicon layer by ion implantation and annealing at a temperature below about 850° C.,
   delineating portions of said polycrystalline silicon layer by photolithography and dry etching to leave polycrystalline silicon portions with sidewall angles of at least 90°.
   thermally oxidizing said polycrystalline silicon portions and removing the resulting thermally oxidized portions by etching to leave polycrystalline silicon portions of controlled submicrometer thickness and length, and
   forming a desired pattern of PN junctions in said substrate using the controlled submicrometer length polycrystalline silicon portions as a mask.

27. A method for fabricating a semiconductor integrated circuit structure including a submicrometer length device element in a transistor having a gate comprising:
   forming a first insulating layer on the surface of a semiconductor substrate which is designated to be in part a dielectric layer of said gate,
   depositing a polycrystalline silicon layer on said insulating layer, heavily doping said polycrystalline silicon layer by ion implantation and annealing at a temperature below about 850° C.,
   delineating portions of said polycrystalline silicon layer by photolithography and dry etching to leave polycrystalline silicon portions with sidewall angles of at least 90°.

thermally oxidizing said polycrystalline silicon portions and removing the resulting thermally oxidized portions by etching to leave polycrystalline silicon portions of controlled submicrometer thickness and length, and implanting ions into said semiconductor substrate using the controlled submicrometer length polycrystalline silicon portions as a mask to define a desired pattern of PN junctions.

* * * * *